US008435415B2

(12) United States Patent
Stavis et al.

(10) Patent No.: US 8,435,415 B2
(45) Date of Patent: May 7, 2013

(54) NANOFABRICATION PROCESS AND NANODEVICE

(75) Inventors: Samuel Martin Stavis, North Potomac, MD (US); Elizabeth Arlene Strychalski, North Potomac, MD (US); Michael Gaitan, North Potomac, MD (US)

(73) Assignees: The United States of America, as represented by the Secretary of Commerce, the National Institute of Standards and Technology, Washington, DC (US); Cornell University—Cornell Center for Technology, Enterprise & Commercialization, Ithaca, NY (US)

( * ) Notice: Subject to any disclaimer, the term of this patent is extended or adjusted under 35 U.S.C. 154(b) by 580 days.

(21) Appl. No.: 12/625,077

(22) Filed: Nov. 24, 2009

(65) Prior Publication Data

US 2011/0123771 A1   May 26, 2011

(51) Int. Cl.
*B44C 1/22* (2006.01)
*C23F 1/00* (2006.01)

(52) U.S. Cl.
USPC .......... 216/41; 216/2; 216/58; 216/67; 430/5; 430/313

(58) Field of Classification Search ............... 216/2, 41, 216/58, 67; 430/5, 313
See application file for complete search history.

(56) References Cited

U.S. PATENT DOCUMENTS

| | | | |
|---|---|---|---|
| 6,635,163 B1 | 10/2003 | Han et al. | |
| 6,979,521 B1 * | 12/2005 | Liu | 430/5 |
| 7,169,251 B2 | 1/2007 | Guo et al. | |
| 7,427,343 B2 | 9/2008 | Han et al. | |
| 2005/0118531 A1 * | 6/2005 | Lee et al. | 430/311 |
| 2005/0233228 A1 | 10/2005 | Fijol et al. | |
| 2007/0175860 A1 | 8/2007 | Liu | |
| 2008/0135866 A1 * | 6/2008 | Donofrio | 257/98 |
| 2010/0203299 A1 * | 8/2010 | Abdallah et al. | 428/195.1 |

FOREIGN PATENT DOCUMENTS

| | | |
|---|---|---|
| WO | 2008115626 | 9/2008 |
| WO | 2008127438 | 10/2008 |

OTHER PUBLICATIONS

Xia, et al., "Unconventional Methods for Fabricating and Patterning Nanostructures," Chemical Reviews, vol. 99, No. 7, 1999, pp. 1823-1848.
Cao, et al., "Gradient Nanostructures for Interfacing Microfluidics and Nanofluidics", Applied Physics Letters, vol. 81, No. 16, Oct. 14, 2002, pp. 3058-3060.
Strychalski, et al., "Non-Planar Nanofluidic Devices for Single Molecule Analysis Fabricated Using Nanoglassblowing," Nanotechnology, vol. 19, 2008, 315301, 8 pp.
Li, et al., "Rapid Three-Dimensional Manufacturing of Microfluidic Structures Using a Scanning Laser System," Applied Physics Letters, vol. 85, No. 12, Sep. 20, 2004, pp. 2426-2428.

(Continued)

*Primary Examiner* — Shamim Ahmed
(74) *Attorney, Agent, or Firm* — Carlson, Gaskey & Olds

(57) ABSTRACT

A nanofabrication process for use with a photoresist that is disposed on a substrate includes the steps of exposing the photoresist to a grayscale radiation pattern, developing the photoresist to remove a irradiated portions and form a patterned topography having a plurality of nanoscale critical dimensions, and selectively etching the photoresist and the substrate to transfer a corresponding topography having a plurality of nanoscale critical dimensions into the substrate.

11 Claims, 3 Drawing Sheets

OTHER PUBLICATIONS

Ke, et al., "Rapidly Prototyped Three-Dimensional Nanofluidic Channel Networks in Glass Substrates", Analytical Chemicstry, vol. 77, No. 16, Aug. 15, 2005, pp. 5083-5088.

Anderson, et al., "Single Photomask, Multilevel Kinoforms in Quartz and Photoresist: Manufacture and Evaluation," Applied Optics, vol. 29, No. 28, Oct. 1, 1990, pp. 4259-4267.

Geissler, et al., "Patterning: Principles and Some New Developments," Advanced Materials, vol. 16, No. 15, Aug. 4, 2004, pp. 1249-1269.

Oppliger, et al., "One-Step 3D Shaping Using a Gray-Tone Mask for Optical and Microelectronic Applications," Microelectronic Engineering, vol. 23, 1994, pp. 449-454.

Waits, et al., "Microfabrication of 3D Silicon Mems Structures Using Gray-Scale Lithography and Deep Reactive Ion Etching," Sensors and Actuators, vol. 119, 2005, pp. 245-253.

Atencia, et al., "Using Pattern Homogenization of Binary Grayscale Masks to Fabricate Microfluidic Structures with 3D Topography," Lab Chip, vol. 7, 2007, pp. 1567-1573.

Henke, et al., "Simulation and Process Design of Gray-Tone Lithography for the Fabrication of Arbitrarily Shaped Surfaces," Jpn. J. Appl. Phys., vol. 33, 1994, pp. 6809-6815.

Waits, et al., "Investigation of Gray-Scale Technology for Large Area 3D Silicon MEMS Structures," Journal of Micromechanics and Microengineering, vol. 13, 2003, pp. 170-177.

Lin, et al, "An Application of White Light Interferometry in Thin Film Measurements," White Light Interferometry, May 1972, pp. 269-276.

Odijk, "Scaling Theory of DNA Confined in Nanochannels and Nanoslits," Physical Review, E 77, 060901(R), 2008, 4 pp.

Cross, et al., "Size-Dependent DNA Mobility in Nanochannels," Journal of Applied Physics, vol. 102, 024701, 2007, 5 pp.

Tegenfeldt, et al., "Micro- and Nanofluidics for DNA Analysis," Anal Bioanal Chem, vol. 378, 2004, pp. 1678-1692.

Mannion, et al., "Review Nanofluidic Structures for Single Biomolecule Flourescent Detection," Biopolymers, vol. 85, No. 2, Published online Nov. 13, 2006 in Wiley InterScience (www.interscience.wiley.com), pp. 131-143.

Reccius, et al., "Conformation, Length, and Speed Measurements of Electrodynamically Stretched DNA in Nanochannels," Biophysical Journal, vol. 95, Jul. 2008, pp. 273-286.

Stavis, et al., "Single Molecule Analysis of Bacterial Polymerase Chain Reaction Products in Submicrometer Fluidic Channels," Biomicrofuidics, vol. 1, 034108, 2007, 13 pp.

Liang, et al., "Nanogap Detector Inside Nanofluidic Channel for Fast Real-Time Label-Free DNA Analysis," Nanoletters, vol. 8, No. 5, pp. 1472-1476, Apr. 17, 2008.

Li, et al., "Ion-Beam Sculpting at Nanometre Length Scales," Nature, vol. 412, Jul. 12, 2001, www.nature.com, pp. 166-169.

Tegenfeldt, et al., "The Dynamics of Genomic-Length DNA Molecules in 100-nm Channels," PNAS, vol. 101, No. 30, Jul. 27, 2004, www.pnas.org/cgi/doi/10.1073/pnas.0403849101, pp. 10979-10983.

Foquet, et al., "Focal Volume Confinement by Submicrometer-Sized Fluidic Channels," Analytical Chemistry, vol. 76, No. 6, Mar. 15, 2004, pp. 1618-1626.

Hsieh, et al., "Ionic Effects on the Equilibrium Dynamics of DNA Confined in Nanoslits," Nano Letters, vol. 8, No. 6, pp. 1683-1688, 2008.

Hsieh, et al., "An Experimental Study of DNA Rotational Relaxation Time in Nanoslits," Macromolecules, vol. 40, 2007, pp. 5196-5205.

Strychalski, et al., "Diffusion of DNA in Nanoslits," Macromolecules, vol. 41, 2008, pp. 7716-7721.

Jo, et al., "A Single-Molecule Barcoding System Using Nanoslits for DNA Analysis," PNAS, vol. 104, No. 8, Feb. 20, 2007, pp. 2673-2678.

Han, et al., "The Separation of Long DNA Molecules in a Microfabricated Entropic Trap Array," Science, vol. 288, May 12, 2000, www.sciencemag.org, pp. 1026-1029.

Fu, et al., "A Patterned Anisotropic Nanofluidic Sieving Structure for Continuous-Flow Separation of DNA and Proteins," Nature, vol. 2, Feb. 2007, www.nature.com/naturenanotechnology, pp. 121-128.

\* cited by examiner

NANOFABRICATION PROCESS AND NANODEVICE

BACKGROUND OF THE INVENTION

This disclosure relates to processes for patterning and etching a substrate to form a complex three dimensional surface topography defined by a plurality of nanometer scale critical dimensions and devices manufactured using such processes.

Lithography (e.g., photolithography) is known and used for fabricating nanofluidic devices, integrated circuits, and the like. As an example, a typical nanofluidic device may include a fluidic channel with a nanometer scale depth for the manipulation and analysis of biomolecules, such as nucleic acids and proteins.

Currently, photolithography is one method that is used to fabricate such nanofluidic channels. For instance, a photoresist layer may be deposited onto a substrate and then exposed to a light pattern created using a photomask. The portions of the photoresist that are exposed to the light are either rendered resistant to a developer (i.e., when a negative photoresist is used) or soluble in the developer (i.e., when a positive photoresist is used). In either case, the developer removes the portions of the photoresist that are soluble to thereby expose the underlying substrate. The exposed portions of the substrate are then etched to a nanometer scale depth which may be enclosed to form a fluidic channel. Thus, one iteration of applying the photoresist, exposing the photoresist to the light pattern, and etching the substrate forms a mono-depth channel in the substrate. Traditional lithography is therefore planar with respect to the features formed in a single iteration. Additional channels or channel depths can be formed using additional iterations but require precise alignment of the photomask relative to the channels formed in prior iterations. Moreover, features from different iterations must overlap to form a continuous channel, which can result in multiple etches in the overlapping region that limit device design and functionality.

The inherent dimensional limitations on serial patterning and alignment limit the geometry, number and size of the channel depths that can be formed and prevent the fabrication of some complex three dimensional surface features. Indeed, since the utility of a nanodevice is in general proportional to its complexity and dimensionality, current devices provide relatively limited ability to manipulate biomolecules or other analytes of interest.

SUMMARY OF THE INVENTION

An exemplary nanofabrication process for use with a photoresist that is disposed on a substrate includes the steps of exposing the photoresist to a grayscale radiation pattern of spatially varied intensity, developing the photoresist to remove irradiated portions of the photoresist and form a photoresist etch mask with a patterned surface topography having a plurality of nanoscale critical dimensions, and selectively etching the photoresist and the substrate to transfer a corresponding patterned topography having a plurality of nanoscale critical dimensions into the substrate to form a device with a complex three dimensional surface defined by a plurality of nanoscale critical dimensions.

In another aspect, an exemplary nanofabrication process includes selectively etching the photoresist and the substrate using an etchant gas mixture to transfer a corresponding patterned topography having a plurality of nanoscale critical dimensions into the substrate, and controlling an amount of oxygen in the etchant gas mixture in order to establish an etching selectivity of about 0.35-0.65. The etching selectivity is a ratio of an etching removal rate of the substrate to an etching removal rate of the photoresist.

An exemplary nanodevice that may be fabricated using the disclosed nanfabrication processes includes a substrate having an elongated channel that includes a plurality of nanoscale critical dimensions arranged as a stepped gradient across the elongated channel.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
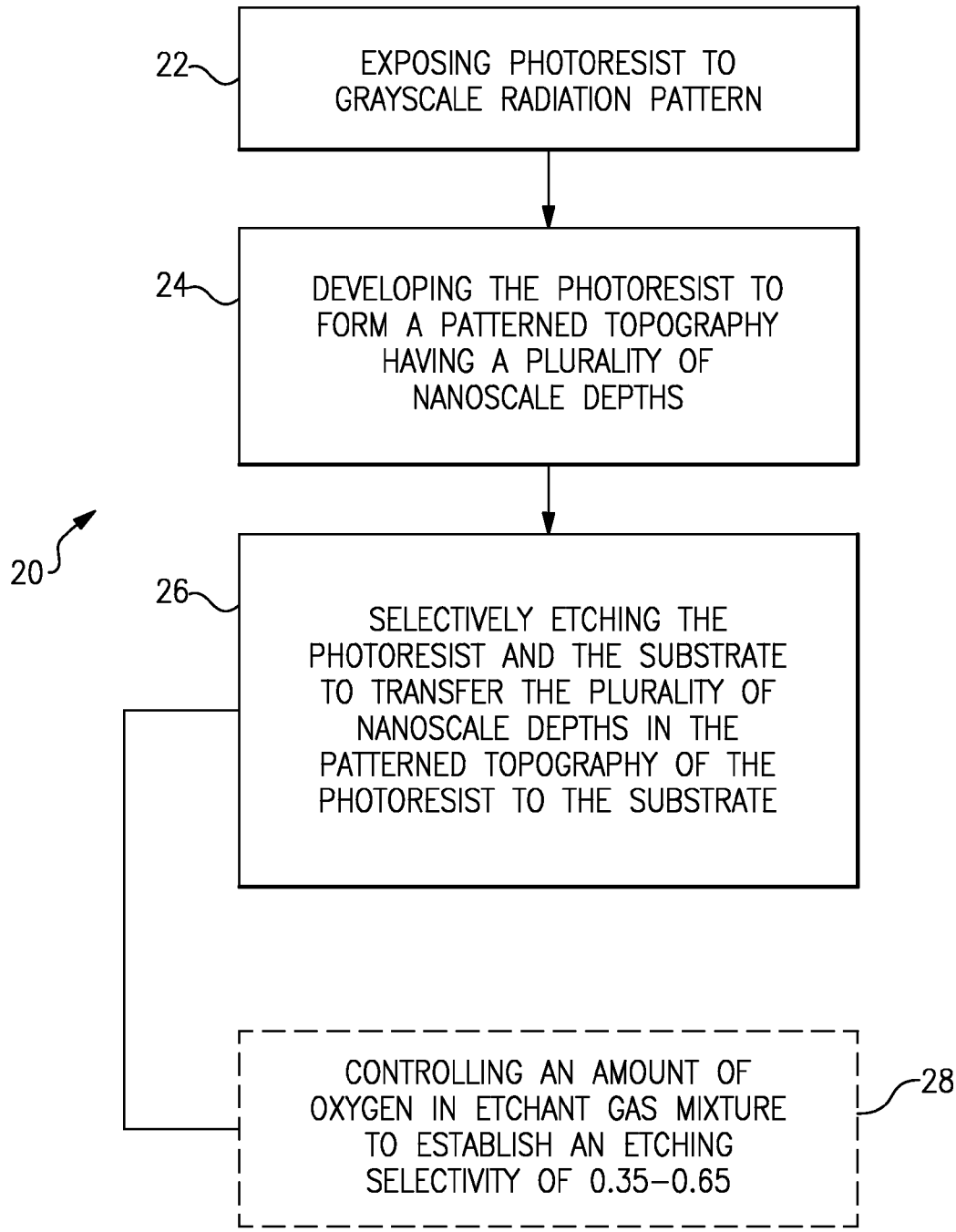
FIG. 1 illustrates an example of a nanofabrication process.

FIG. 1 illustrates an example of nanofabrication process 20 that may be used with a photoresist that is disposed on a substrate to form a nanodevice. As will be appreciated from the following description, the nanofabrication process 20 may be adapted to form a variety of different types of nanodevices that are unavailable using conventional techniques. In a few examples, the nanofabrication process 20 may be used to form a nanofluidic device, integrated circuit, nanomolding tool, resonator, or other device that would benefit from the ability to form complex three dimensional surface topographies defined by a plurality of nanometer scale or nanoscale critical dimensions. As an example, the terms "nanometer scale" or "nanoscale" may refer to a critical dimension or characteristic dimension of up to about one-hundred nanometers. In comparison, larger dimensions of up to one micrometer may be referred to as "submicrometer" and dimensions exceeding one micrometer and up to about one-hundred micrometers may be referred to as "micrometer scale."

The exemplary nanofabrication process 20 includes an exposure step 22, a developer step 24, and a transfer step 26. As will be described, the transfer step 26 may optionally include the action 28 of controlling an amount of oxygen gas in an etchant gas mixture used to etch a photoresist and substrate. The following description of the nanofabrication process 20 will be made with reference to a substrate and a photoresist layer disposed on the substrate. The type of substrate and photoresist materials may vary, depending on the application. However, some examples may utilize a fused silica substrate having a surface roughness of approximately less than 5 angstroms and a polymeric photoresist. As an example, the photoresist may be MEGAPOSIT SPR 700 1.2. The photoresist may be applied in a known manner, such as by using a spin coat technique. In some examples, the photoresist may be applied at an angular acceleration of 8,000 revolutions per minute and then baked at around 95° C. for about 2 minutes. The resulting photoresist thickness may be about 1070±10 nanometers.

Turning first to the exposure step 22, a user of the nanofabrication process 20 exposes the photoresist to a grayscale radiation pattern of varied intensity. The term "grayscale" refers to a controlled radiation intensity over some area of the pattern. As an example, lower intensity radiation does not penetrate as deeply into the photoresist as higher intensity radiation. Thus, the pattern can be designed to imprint a complex three dimensional topography (e.g., a surface pattern) into the photoresist from the "top down."

In a further example of forming a grayscale radiation pattern, a photomask having a diffractive pattern may be used. For instance, the photomask may be formed on a transparent substrate using known techniques. The substrate includes a pattern of opaque areas, such as squares, disposed thereon such that the photomask reduces incident radiation into a grayscale pattern.

In one specific example, a chromium-on-quartz photomask may be used in conjunction with a reduction stepper as a diffraction or spatial frequency filter. The photomask may be patterned with a diffractive array of chromium squares of size s on a square lattice of pitch p. The reduction stepper illuminates the photomask with light of wavelength $\lambda_s$ and partial coherence parameter $\sigma_s$, and a lithographic lens projects the pattern onto the photoresist with a reduction factor of $1/M_s$. With appropriate selection of s and p, diffractive orders other than zero are rejected by the lens aperture. As the zeroth diffractive order determines only the amplitude of the image intensity, individual elements within the diffractive arrays are not resolved, and a grayscale of uniform intensity results. The stepper resolution determines the critical aerial pitch per Equation (1) below, while the diagonal spacing between adjacent elements in the diffractive arrays on the photomask determines the critical square size per Equation (2) below. Diffractive array pitches larger than $p_c$ or squares smaller than $s_c$ will result in fluctuations in aerial intensity as diffractive elements begin to resolve. When Equations (1) and (2) are satisfied, the aerial image intensity of a grayscale is represented per Equation (3) below, where $I_0$ is the incident illumination intensity.

$$p'_c = \frac{1}{1+\sigma_s} \frac{\lambda_s}{NA_s} \quad (1)$$

$$s_c = p - \sqrt{\frac{p_c^2}{2}} \quad (2)$$

$$I'_{GS} = I_0 \left(1 - \left(\frac{s^2}{p^2}\right)\right)^2 \quad (3)$$

In one example, a staircase function grayscale aerial intensity pattern may be rendered with diffractive arrays of chromium squares varying in size from s=1.37 to 2.24 micrometers on a fixed pitch p=4.00 micrometers. The photomask may have a critical dimension tolerance of 15 nanometers (absolute error), critical dimension uniformity of 15 nanometers (maximum range) and an address unit of 5 nanometers. In this case, the photomask creates thirty different grayscale depths having an aerial width of 4.00 micrometers defined by diffractive arrays five square elements wide. The aerial grayscale intensity $I_{GS}$ normalized by the incident illumination intensity $I_0$ is a function of square size s. Many more grayscales depths can be rendered by varying the diffractive array lattice structure, pitch, or element shape, or by specifying a photomask with improved critical dimension tolerance and uniformity. Non-planar nanofluidic structures with submicrometer lateral dimensions could also be fabricated by reducing the width of the diffractive arrays to one diffractive element per unit pitch.

A calibration photomask may be used to characterize the response of a particular type of photoresist to grayscale exposure. For instance, the incident illumination intensity $I_0$ is the dose required to fully clear the photoresist during development. In one example, an approximately linear response may occur over a usefully large range and may simplify subsequent nanofabrication process design.

After exposure, the substrate and the irradiated photoresist are developed in the developer step 24. The type of developer used may depend, for example, on the type of photoresist selected for use. In this case, the developer removes the irradiated portions and partially irradiated portions of the photoresist (i.e., a positive photoresist). The non-irradiated portions are insoluble in the developer and remain on the substrate. The developer thereby forms a patterned topography in the photoresist. The patterned topography corresponds to the pattern imprinted by the grayscale radiation pattern and includes a plurality of nanoscale critical dimensions. That is, the grayscale radiation pattern may be designed to create a desired patterned topography in the photoresist, with features having critical dimensions of nanoscale size. The physical structure of a "critical dimension" may depend on the type of feature but may include dimensions such as photoresist film thicknesses, feature heights or depths, steps in photoresist film thickness or feature height or depth, gradients of smooth surfaces which are sloped or curved, and the like. Generally, the critical dimension can be regarded as the smallest geometrical dimension which can be formed.

Turning now to the transfer step 26, the plurality of nanoscale critical dimensions of the patterned topography is then transferred from the photoresist to the substrate. One premise of this disclosure is that the nanofabrication process 20 provides the ability to form a plurality of nanoscale critical dimensions that comprise a complex three dimensional topography, in a substrate in a single pattern transfer process without the need for multiple patterning and etching cycles or alignment of photomasks as in standard photolithography.

Figure 2:
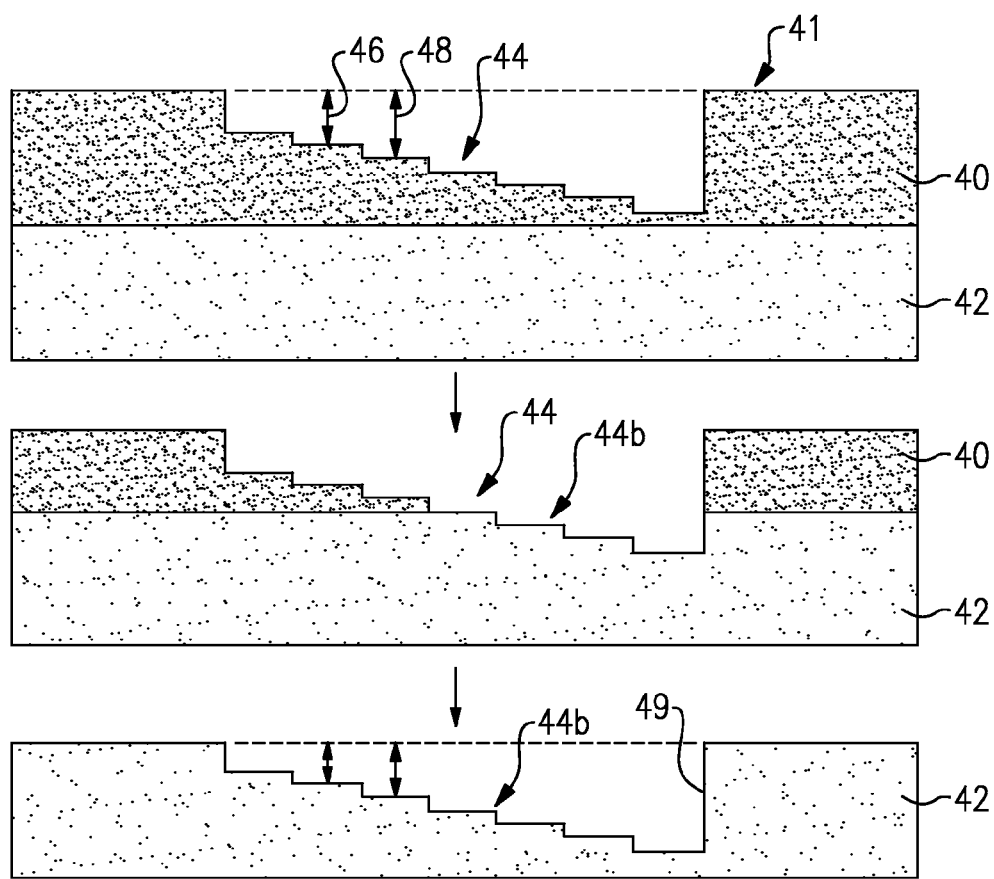
FIG. 2 illustrates sequential views of selectively etching a photoresist etch mask and substrate according to a nanofabrication process.

As illustrated in the progressive views of FIG. 2, the photoresist 40 initially includes a patterned topography 41 having the plurality of nanoscale critical dimensions 44 (steps in this example). In this case, the plurality of critical dimensions 44 includes seven steps having nanoscale heights and arranged as a stepped gradient from a shallowest depth to a deepest depth. A depth 46, for instance, is less than the next, deeper depth 48 and so on and so forth. In other examples, the patterned topography 41 may include fewer nanoscale critical dimensions 44 or more nanoscale critical dimensions, or the topography may have a pattern that is not a staircase structure. The depths from the surface of the photoresist 40 may be nanoscale (in which case this is considered to be a critical dimension) or submicrometer scale, and the height or step size may also be nanoscale (in which case the step size is considered to be a critical dimension).

The photoresist 40 and the substrate 42 are selectively etched to transfer the plurality of nanoscale critical dimensions 44 to the substrate 42. One example etching process is isotropic reactive ion etching. For instance, as shown in the middle progression of FIG. 2, an etchant initially removes the thinnest portion of the photoresist 40 to expose the underlying substrate 42. Once exposed, the etchant also removes the substrate 42 and continues to remove the thicker portions of the photoresist 40 to expose additional substrate 42 area. Thus, the etchant cuts deeper into the initially exposed area of the substrate 42 than the area that is last exposed to thereby transfer the plurality of nanoscale critical dimensions 44 into the substrate 42, as in the bottom progression. As an example, the etching may be ceased shortly after the etchant removes the last step of the plurality of nanoscale critical dimensions 44. The etching duration is selected such that the thickest portions may not be completely removed.

The etching is controlled to effect transfer of the nanoscale critical dimensions 44 in the patterned topography 41 of the photoresist 40 into the substrate 42. As an example, the etchant may be an etchant gas mixture that is designed to selectively etch the photoresist and the substrate 42. In comparison, the typical desire in traditional photolithograpy is to limit the etching of the photoresist (e.g.; high selectivity) in order to protect the substrate from exposure. However, the etchant gas mixture of the nanofabrication process 20 may be a relatively low selectivity, multi-component mixture for etching the photoresist 40 and the substrate 42. For instance, the etchant gas mixture may include a first etchant primarily for etching the photoresist 40 and a second etchant primarily for etching the substrate 42. In one example, the etchant gas mixture may include oxygen gas and a fluorinated gas, such as trifluoromethane gas. The oxygen generally etches the photoresist 40, while the fluorinated gas etches the substrate 42.

A user may control the amount of the oxygen gas in the etchant gas mixture to establish a desirable etching ratio between the substrate 42 and the photoresist 40 to transfer a patterned topography having a plurality of nanoscale critical dimensions 44 in the photoresist 40. The patterned topography transfers as a corresponding patterned topography having a plurality of nanoscale critical dimensions 44b in the substrate 42. For instance, the corresponding patterned topography having a plurality of nanoscale critical dimensions 44b in the substrate 42 may be a down-scaled transfer of the patterned topography of plurality of nanoscale critical dimensions 44 in the photoresist 40. The amount of oxygen in the etchant gas mixture is controlled to establish an etching selectivity of about 0.35-0.65. The etching selectivity is a ratio of an etching removal rate of the substrate 42 to an etching removal rate of the photoresist 40. The flow rate of oxygen gas may be controlled to achieve desired etching rates and selectivities. In one example, the flow rate of the oxygen gas may be about 10-25 standard cubic centimeters per minute, while the flow rate of the fluorinated gas may be around 50 standard cubic centimeters per minute with an overall pressure of about 60 milliTorr. Given this description, one of ordinary skill in the art will be able to recognize other flow rates to suit their particular needs.

In the example of FIG. 2, the etching creates an elongated channel 49 (e.g., extending perpendicular with regard to FIG. 2) in the substrate 42, with the plurality of nanoscale critical dimensions 44b arranged as a stepped gradient across the width of the elongated channel 49. For instance, each step of the stepped gradient may have a nanoscale depth with regard to the surface (as represented by the dashed line) of the substrate 42 and/or a nanoscale step size. The stepped gradient spans across the width of the channel 49, which may be of a macroscale dimension. As an example, a macroscale may be a dimension larger than nanoscale, such as microscale, milliscale or larger. In this respect, the etching can be controlled to produce desired nanoscale critical dimensions of the steps. As an example, the steps may include a depth range and/or step size across several scales from 10 nanometers to 0.6 micrometers.

In the illustrated example, the steps are generally perpendicular, however, in other examples the corners of the steps may be angled non-perpendicularly. In other examples, the gradient may extend lengthwise along the elongated channel rather than across the width. As shown, the elongated channel includes about seven steps. However, in other examples, the nanofabrication process may be used to form smaller, more discrete steps of the stepped gradient, or even a smooth slope. For instance, in some examples, a stepped gradient may include hundreds of steps or even more than 1,000 steps. Additionally, some examples may have a geometry containing no multiply etched regions between adjacent disparate depths, which can result from two or more iterations of traditional photolithography.

Different etching selectivities and durations may be used to fabricate nanostructures with different depth profiles and depth offsets from a single photomask. As an example, a less selective etch within the above-given range may be used to make a "shallow" stepped structure with a step size of about 11 nanometers, no depth offset, and depths controlled from 11±4 nanometers to 332±4 nanometers (mean±standard deviation) across a 120 micrometer width of a channel. A more selective etch may be used to make a "deep" stepped structure with a step size of about 19 nanometers, a depth offset of approximately two-and-a-half steps, and depths controlled from 64±4 nanometers to 624±5 nanometers across a 120 micrometer channel width. The measurements may be made using a scanned probe surface profilometer. The less selective and more selective etches may result in a root mean square surface roughness value of about 3 nanometers and 2 nanometers, respectively.

In use, a cover may be provided over or around the channel 49 such that the channel 49 includes an inlet or inlets at one end and an outlet or outlets at the other end for transporting a material to be analyzed. The nanodevice may also include other structures or components that function in cooperation with the channel 49 for the purpose of facilitating movement of the material through the channel or analyzing the material.

Figure 3:
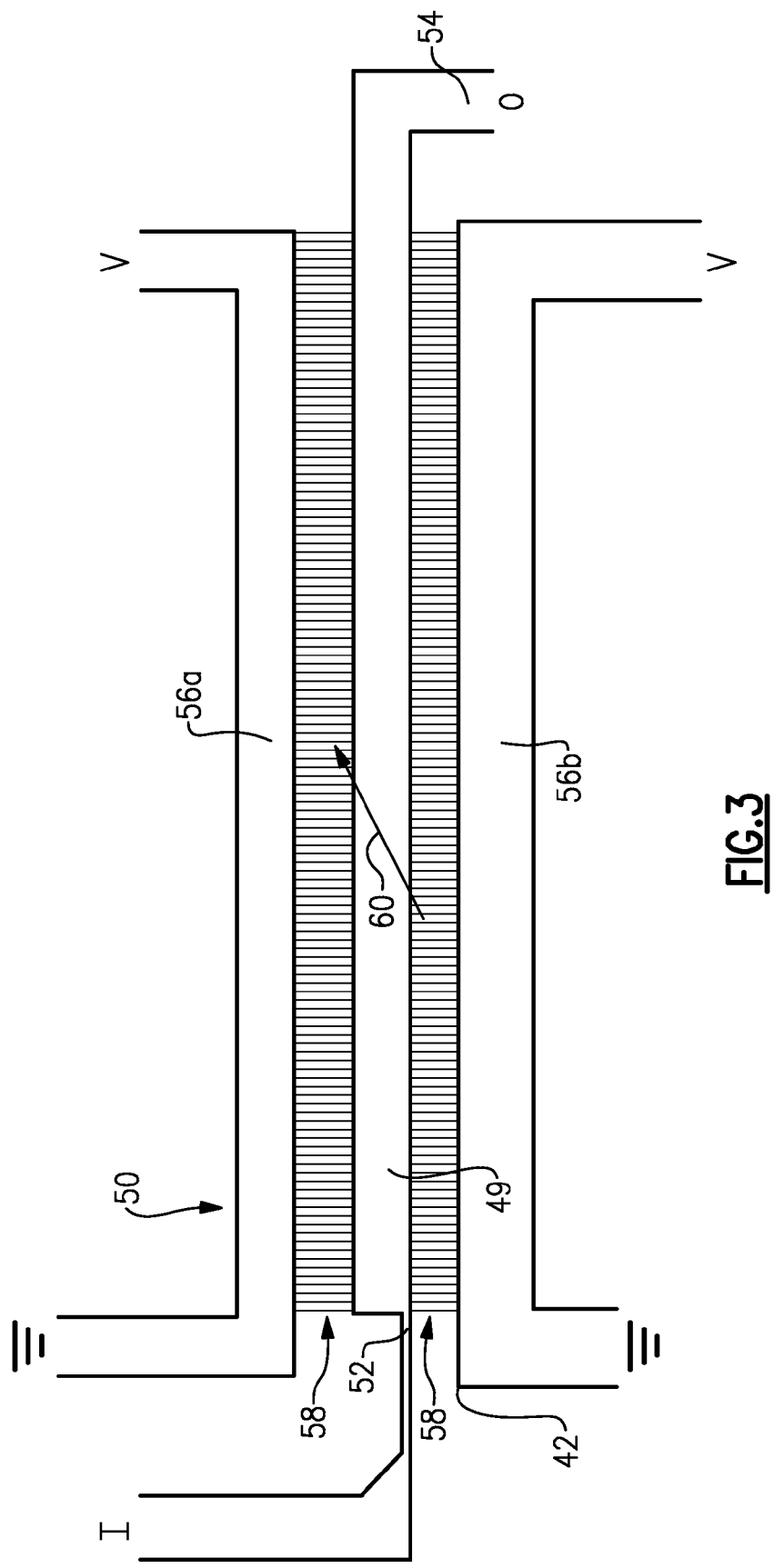
FIG. 3 illustrates an example of a nanodevice having an elongated channel with a stepped gradient across a width of the channel.

FIG. 3 illustrates one implementation of the elongated channel 49. In this example, the elongated channel 49 is included within a nanofluidic device 50. The elongated channel 49 includes an inlet 52 at one end and an outlet 54 at the other end.

The nanodevice 50 further includes first and second voltage control channels 56a and 56b arranged with the channel 49 therebetween. Lateral channels 58 extend between the voltage control channels 56a and 56b and through the channel 49.

In use, conductive fluids flowing through the voltage control channels 56a and 56b facilitate generating an electric field 60 across the channel 49. As an example, the voltage in the second voltage control channel 56b may be greater than the voltage in the first voltage control channel 56a. The applied voltages cooperate with the lateral channels 58 to create a voltage axial offset through the channel 49 that results in an electric field 60 that is oriented in a direction that is transverse to the lengthwise direction of the channel 49.

The electric field 60 facilitates moving materials through the channel 49 between the inlet 52 and the outlet 54. As an example, an axial component of the electric field 60 is oriented along the lengthwise direction of the channel 49 and functions to move material within the channel 49 towards the outlet 54. A lateral component of the electric field 60 that is oriented in a direction perpendicular to the lengthwise direction of the channel 49 functions to drive the material toward the shallow side of the channel 49. As can be appreciated, smaller sized materials will be driven farther into the shallow end of the channel 49 before interfering with the steps of the gradient, which facilitates separating the materials for the purpose of analysis. In this example, the device is electric-driven; however, in other examples, the device may be mechanically-driven by hydrostatic pressure or the like.

The elongated channel 49 and electric field 60 may be used for many different purposes. As an example, the elongated channel 49 may be used for the separation and metrology of nanomaterials, such as nanoparticles, biomolecules, or the like, via the injection of an analyte into the channel such that nanomaterials in the analyte are driven down the channel and across the width of the channel into the shallow side. The steps of the gradient of the channel exclude the nanomaterials by size within spatially separate regions of the channel. A size distribution of the nanomaterials may then be determined using fluorescence microscopy of other applicable technique.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A nanofabrication process for use with a photoresist that is disposed on a substrate, the process comprising:
   a) exposing the photoresist to a grayscale radiation pattern of varied intensity;
   b) developing the photoresist to remove irradiated portions therefrom, in the case of positive tone photoresist or leave only irradiated portions, in the case of negative tone photoresist and thereby form a photoresist etch mask with a patterned topography having a plurality of nanoscale critical dimensions; and
   c) selectively etching the photoresist and the substrate by controlling an etching ratio between the substrate and the photoresist to thereby transfer a corresponding patterned topography having a plurality of nanoscale critical dimensions into the substrate wherein step (c) includes forming an elongated channel having a channel width of macroscale dimension, with the plurality of nanoscale critical dimensions as a stepped gradient across the channel width, and the elongated channel is covered and enclosed forming a nanofluidic device.

2. The nanofabrication process as recited in claim 1, wherein step (c) includes etching using an etchant gas mixture that comprises fluorinated gas and oxygen gas.

3. The nanofabrication process as recited in claim 2, wherein step (c) further includes establishing a gas flow rate of the oxygen gas of about 10-25 standard cubic centimeters per minute.

4. The nanofabrication process as recited in claim 2, wherein step (c) further includes controlling an amount of the oxygen gas in the etchant gas mixture to establish an etching selectivity of about 0.35-0.65, where the etching selectivity is a ratio of an etching removal rate of the substrate to an etching removal rate of the photoresist.

5. The nanofabrication process as recited in claim 4, wherein step (c) includes establishing the etching removal rate of the substrate to be 20-30 nanometers per minute and establishing the etching removal rate of the photoresist to be 45-55 nanometers per minute.

6. The nanofabrication process as recited in claim 1, wherein the plurality of nanoscale critical dimensions in the photoresist extend partially through the photoresist.

7. The nanofabrication process as recited in claim 1, wherein step (a) includes forming the grayscale radiation pattern using a diffractive pattern on a photomask.

8. The nanofabrication process as recited in claim 1, wherein step (c) includes transferring at least seven different nanoscale critical dimensions from the patterned topography of the photoresist into the substrate.

9. The nanofabrication process as recited in claim 1, wherein the exposing of the photoresist to the grayscale radiation pattern of varied intensity produces a photoresist patterned topography having a plurality of nanoscale critical dimensions corresponding to the patterned topography produced after the developing step.

10. The nanofabrication process as recited in claim 1, wherein said step (a) includes using a diffractive pattern to project radiation areas of differing intensity onto the photoresist.

11. The nanofabrication process as recited in claim 1, wherein the plurality of nanoscale critical dimensions includes a plurality of nanoscale critical depth dimensions.

* * * * *